United States Patent [19]

White

[11] E Patent Number: Re. 33,419

[45] Reissued Date of Patent: Nov. 6, 1990

[54] CRYOSTAT ASSEMBLY

[75] Inventor: Keith White, Oxford, England

[73] Assignee: Oxford Advanced Technology Limited, Oxford, England

[21] Appl. No.: 387,578

[22] Filed: Jul. 31, 1989

Related U.S. Patent Documents

Reissue of:

[64] Patent No.: 4,777,807
Issued: Oct. 18, 1988
Appl. No.: 87,528
Filed: Aug. 20, 1987

[30] Foreign Application Priority Data

Sep. 9, 1986 [JP] Japan ..... 61-139251[U]

[51] Int. Cl.[5] ..... F25B 19/00

[52] U.S. Cl. ..... 62/51.1; 62/295; 248/636; 248/638

[58] Field of Search ..... 62/51.1, 295; 248/636, 248/638

[56] References Cited

U.S. PATENT DOCUMENTS

| | | | |
|---|---|---|---|
| 3,609,992 | 10/1971 | Cacheux | 62/51.1 |
| 3,904,394 | 9/1975 | Prast et al. | 62/51.1 |
| 4,300,354 | 11/1981 | Buchs et al. | 62/45.1 |
| 4,535,595 | 8/1985 | Keller et al. | 62/51.1 |
| 4,672,202 | 6/1987 | Crossley, Jr. et al. | 62/51.1 |

*Primary Examiner*—Ronald C. Capossela
*Attorney, Agent, or Firm*—Staas & Halsey

[57] ABSTRACT

A cryostat assembly comprises at least one substantially heat insulating wall surrounding a cooled region for restricting heat flow into the cooled region. A refrigeration system is provided having a heat absorbing portion coupled with the wall to enable heat to transfer to the heat absorbing portion, the refrigeration system also have a heat evacuating portion to enable absorbed heat to be evacuated from the cryostat assembly.

10 Claims, 5 Drawing Sheets

CRYOSTAT ASSEMBLY

Matter enclosed in heavy brackets [ ] appears in the original patent but forms no part of this reissue specification; matter printed in italics indicates the additions made by reissue.

FIELD OF THE INVENTION

The invention relates to cryostat assemblies comprising at least one substantially heat insulating wall surrounding a cooled region for restricting heat flow into the region. Such assemblies are hereinafter referred to as of the kind described.

DESCRIPTION OF PRIOR ART

Cryostat assemblies of the kind described are used in a variety of fields one of which is the field of nuclear magnetic resonance (NMR) imaging wherein superconducting coils of an electromagnet are sitatuated within the cryostat. In order that the coils of the magnet take up a superconducting state it is necessary to cool them to very low temperatures in the order of 4K and conventionally this is achieved by making use of a liquid helium vessel within which the coils are mounted, the helium vessel being sandwiched within a radiation shield, the radiation shield being sandwiched within a liquid nitrogen vessel, and the liquid nitrogen vessel being sandwiched within an evacuated vessel. This series of insulating jackets enables the coils to be maintained at the required low temperature.

One of the problems with these cryostat assemblies is that there is a continuous vapourising of the liquid helium and liquid nitrogen which is boiled off and fresh helium and nitrogen has to be supplied to the respective vessels. This degree of boil off is expensive and generally undesirable.

SUMMARY OF THE INVENTION

In accordance with the present invention, a cryostat assembly comprises at least one substantially heat insulating wall surrounding a cooled region for restricting heat flow into the cooled region; and a refrigeration system having a heat absorbing portion coupled by coupling means with the wall to enable heat to transfer to the heat absorbing portion via the coupling means, and a heat evacuating portion to enable absorbed heat to be evacuated from the cryostat assembly.

With this cryostat assembly, a refrigeration system is added to assist in removing heat from the or each wall to which it is coupled. It has been found that this considerably reduces the liquid coolant consumption where the system includes a coolant vessel. For example, in one system it has been found that liquid nitrogen consumption has been reduced by about 1 liter per hour while liquid helium consumption is reduced by about 200 cc per hour. In some cases, the refrigeration system can reduce liquid nitrogen consumption to substantially zero.

It will be appreciated that the substantially heat insulating wall could comprise part of a wall of a coolant vessel or a heat radiation shield.

The refrigeration system may be of any suitable conventional type such as of the Gifford McMahon type using a closed helium gas cycle. Conveniently, the refrigeration system is a two-stage system, each stage being connected with a different part of the remainder of the assembly. For example, a first (higher temperature) stage of the system may be coupled for heat transfer with an outer radiation shield or coolant vessel and a second (lower temperature) stage may be coupled for heat transfer with an inner radiation shield.

In other examples, a single stage refrigeration system could be used which would typically be coupled for heat transfer with a wall defined by at least part of a coolant vessel.

In many conventional cryostat assemblies, the elements of the assembly are supported by a plurality of support rods. These provide an undesirable source of heat supply to the vessel or shield to which they are connected and are conventionally made of low heat conductivity material. However, some heat conduction does take place and it is particularly convenient if the refrigeration system is coupled for heat transfer with at least one of the support rods. This coupling may be direct in the sense that the coupling means extends between the support and the refrigeration system, but would typically be indirect. Thus, at least one of the support rods is coupled with another wall or vessel which itself is coupled with the refrigeration system whereby a heat flow path exists from the rod via the wall or vessel to the refrigeration system.

Preferably, the or each coupling means comprises a flexible, highly heat conductive linkage. Flexibility is desirable to cope with relative movement between the refrigeration system and the element to which it is connected and high heat conductivity is required for rapid dissipation of heat.

Conveniently, the coupling means comprises copper braid. The precise dimensions of the braid depends on the powers available at the refrigeration system and on the other properties of the cryostat assembly.

In some cases, it is desirable to be able to replace the refrigeration system with an alternative system or to remove the system for repair. In general, this would require considerable disassembly of the cryostat, including for example removing coolant.

Preferably, therefore, the refrigeration system comprises a support housing, and a refrigeration unit removably mounted in the support housing, heat conducting contacts being provided on the unit and in the support housing connected with the coupling means whereby when the unit is fully mounted in the support housing the contacts engage one another to provide a heat path between the unit and the coupling means through the support housing, the support housing being adapted to restrict heat flow from outside the crystat assembly to the coupling means.

This arrangement enables the refrigeration unit to be removed and inserted either for replacement or for repair without having to dissassemble the remainder of the cryostat and in particular without having to empty the coolant vessel or vessels.

It is particularly convenient if the walls of the support housing are insulated against heat flow.

BRIEF DESCRIPTION OF THE DRAWINGS

Some examples of cryostats in accordance with the present invention will now be described with reference to the accompanying drawings, in which:

*FIG. 2 is a partial cross-section through a cryostat assembly for use in a nuclear magnetic resonance apparatus;*

*FIG. 3 is a view similar to FIG. 2 but of an example of the invention;*

DETAILED DESCRIPTION OF EMBODIMENTS

Figure 1:
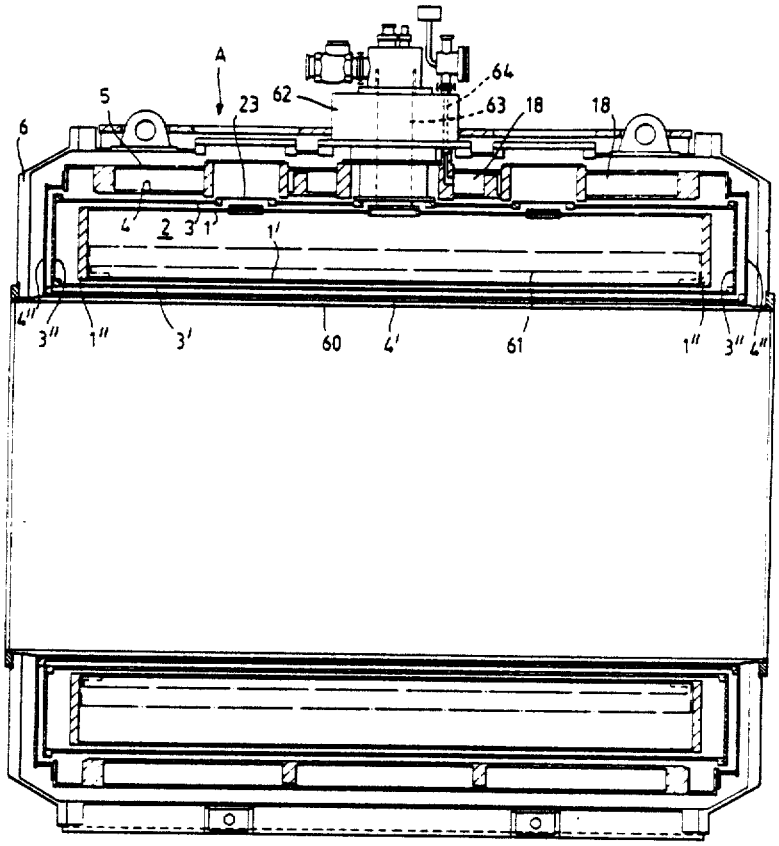
FIG. 1 is a partly cut away side elevation of a cryostat with the refrigeration system omitted.

FIG. 1 illustrates the general form of a cryostat assembly which comprises a number of cylindrical, aluminium alloy, or stainless steel walls which are connected to define liquid coolant vessels and radiation shields as will be explained. A central wall 1 defines with another, coaxial wall 1' and end walls " a liquid helium vessel 2. The vessel 2 on one side is surrounded by a cylindrical wall 3 defining an inner radiation shield and by another radiation shield 3' on its other side connected with end walls 3". A liquid nitrogen vessel defined by two pairs of cylindrical walls 4,5 and its extension 4' connected to end wall extension 4" sandwiches the radiation shields. An outer vacuum jacket 6 surrounds the liquid nitrogen vessel and extension. A cylindrical bore 60 is defined by the innermost cylindrical wall defining part of the wall of the inner vacuum jacket. In addition, in nuclear magnetic resonance apparatus, coils of a main superconducting magnet 61 are situated within the helium vessel 2 which constitutes a cooled region.

A turret 62 is positioned on top of the cryostat assembly through which a helium boil-off port 63 and one or more nitrogen boil-off ports 64 extend.

Figure 2:
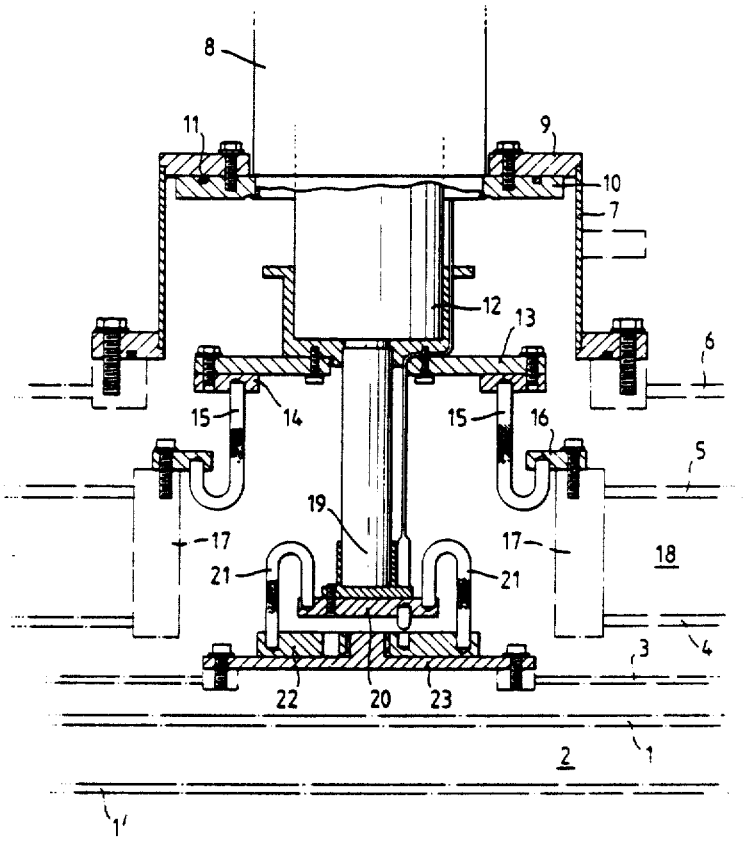
[FIG. 2 is a partial cross-section through a first example of a cryostat assembly according to the invention for use in nuclear magnetic resonance apparatus;]

FIG. 2 illustrates part of the cryostat assembly shown in FIG. 1 and in particular the section indicated at A in FIG. 1. In FIG. 1 the refrigeration elements shown in FIG. 2 have been omitted.

A turret 7 having a vacuum jacket is bolted to the wall of the jacket 6. A two stage refrigeration unit 8 of the Gifford McMahon type (such as manufactured by Leybold Heraeus) is bolted to the turret 7 via flanges 9, 10 and A seal 11. The first (higher temperature) stage of the refrigerator 12 is bolted in a high conductivity copper flange 13 which in turn is bolted to an annular, auxiliary flange 14 to which one end of a number of flexible, high conductivity copper braid links 15 are soft soldered.

The other end of each link 15 is soft soldered to an annular, high conductivity copper flange 16 bolted to an annular end wall 17 of the liquid nitrogen vessel 18.

The second (lower temperature) stage 19 of the refrigerator 8 is bonded to a high conductivity copper flange 20 to which a number of further high conductivity copper braid links 21 are soft soldered. The other end of the links 21 are soft soldered to a copper flange 22 bolted via an intermediate copper flange 23 to the inner shield 3.

The arrangement shown in FIG. 2 enables the refrigeration power to be transferred from the first stage 12 to the liquid nitrogen vessel 18 via the flanges 13, 14 (which may be segmented) and the links 15 and to the inner shield 3 via the flanges 20, 22, 23 and the links 21.

The links, 15, 21 are of sufficient length, cross-sectional area, and number to provide for movement between the refrigerator and the parts to which it is connected and to adequately transfer the refrigerator power to the nitrogen vessel and shield. The precise dimensions of the braids depend on the powers available at each stage of the refrigerator used and on the cryostat system.

It has been found that the system shown in FIG. 2, when used in NMR apparatus, enables a reduction in liquid nitrogen consumption of about 1 liter per hour, compared with the unrefrigerated system, and a reduction in liquid helium consumption of about 200 cc per hour.

Figure 3:
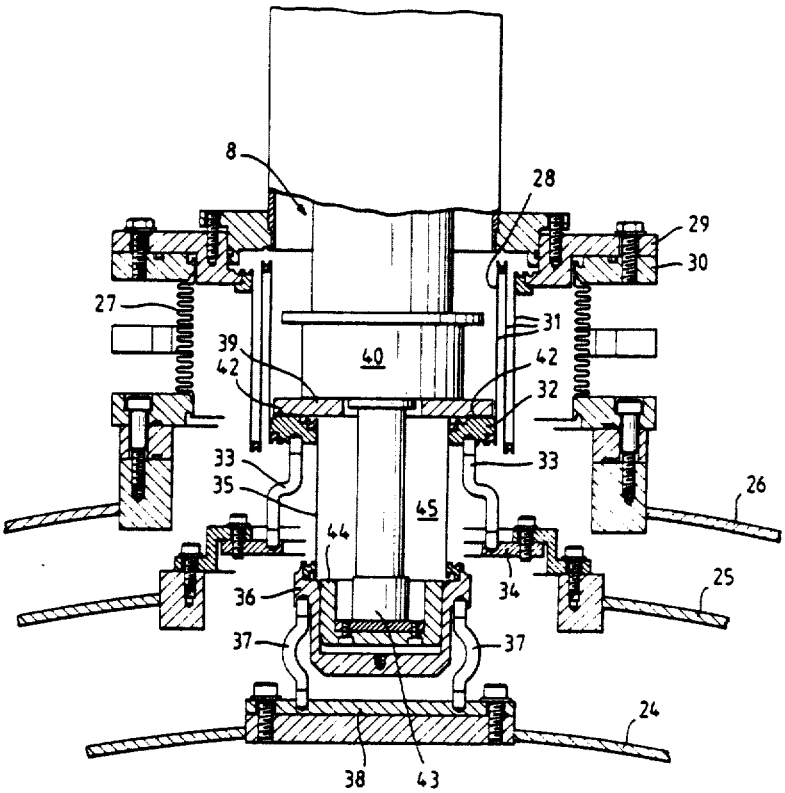
[FIG. 3 is a view similar to FIG. 2 but of a second example;]

It will be seen from FIG. 2 that if it is desired to remove the refrigeration unit 8 for the purposes of repair or replacement, it is necessary to destroy the vacuum within the vacuum jacket and this requires the preliminary removal of all liquid helium and liquid nitrogen coolant. FIG. 3 shows an arrangement in which removal and replacement of the refrigeration unit 8 can be achieved very simply without coolant removal.

FIG. 3 illustrates only a part of another cryostat assembly including three concentric walls 24, 25, 26. The wall 24 defines the outer cylinder of the inner radiation shield and is surrounded by the wall 25 which constitutes the outer cylinder of the outer radiation shield. In this case there is no nitrogen vessel. The shield 25 is surrounded by an outer vacuum jacket 26. An anti-vibration mounting is provided part of which is shown at 27. In this example, the refrigeration unit 8 is mounted to the remainder of the cryostat assembly by insertion into a support housing 28. The support housing 28 has an outer flange 29 bolted to a turret flange 30. Flange 30 is supported from the lower bolted flange by a set of springs which are adjusted by means of screws and the intermediate flange so that the flange 30 is resiliently supported against the force of air pressure. The resiliency of this support considerably reduces the vibration from the refrigerator being transmitted to the outer vacuum wall 26, whence it would be re-radiated into the environment. A radially inner portion of the housing 28 is defined by a triple wall 31 comprising three concentric cylinders terminating in an inner flange 32 of highly conductive copper. The triple wall 31 is to increase the heat path length between room temperature and the outer shield 26. The flange 32 may be equated with the flange 13 in FIG. 2 and links 33 of highly conductive copper braid are soft soldered between the flange 32 and another copper flange 34 coupled with the radiation shield 25. The housing 28 has a further inner, cylindrical wall part 35 sealed to a radially inner surface of the flange 32 and supporting at its lower end a copper nose 36 sealed to its outer surface. Copper braid links 37 are soft soldered between the nose 36 and a copper plate 38 coupled with the wall 24.

The refrigeration unit 8 is mounted within the support housing 28 so that a copper flange 39 connected to the first stage 40 of the unit 8 is pressed against an indium metal pressure contact 42 to enable the first stage 40 to be coupled for heat transfer with the links 33.

The second stage 43 of the refrigerator unit includes a copper cylinder 44 which forms a close fit within the nose 36. Contact between the cylinder 44 and the nose 36 is achieved by filling a cavity 45 within the housing 28 with helium gas at about 1 atmosphere (although much lower pressures are feasible).

If it is desired to remove or replace the refrigeration unit 8, this is simply unbolted at its outer end and slid out of the support housing 28. This removal does not open any access to the jackets of the cryostat and so any vacuum within those jackets is not destroyed.

Figure 4:
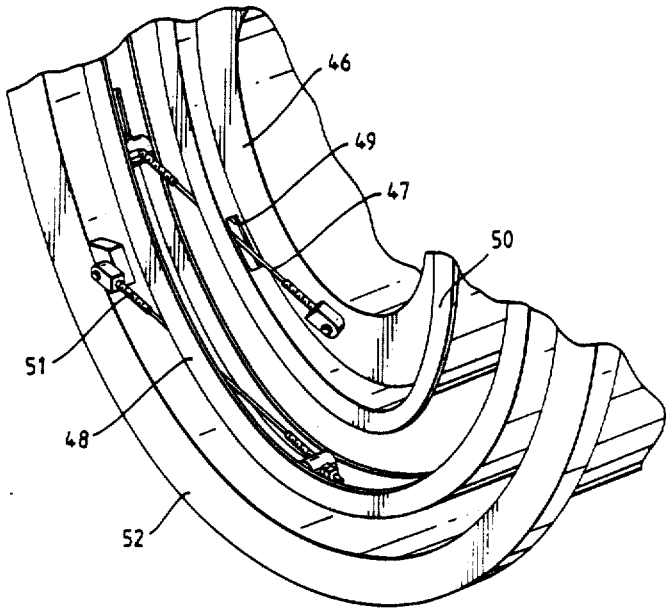
FIG. 4 is a partial perspective view from one end with some parts removed of a cryostat assembly illustrating support rods; and, FIG. 5 illustrates the coupling of a support rod within an inner radiation shield.
Figure 5:
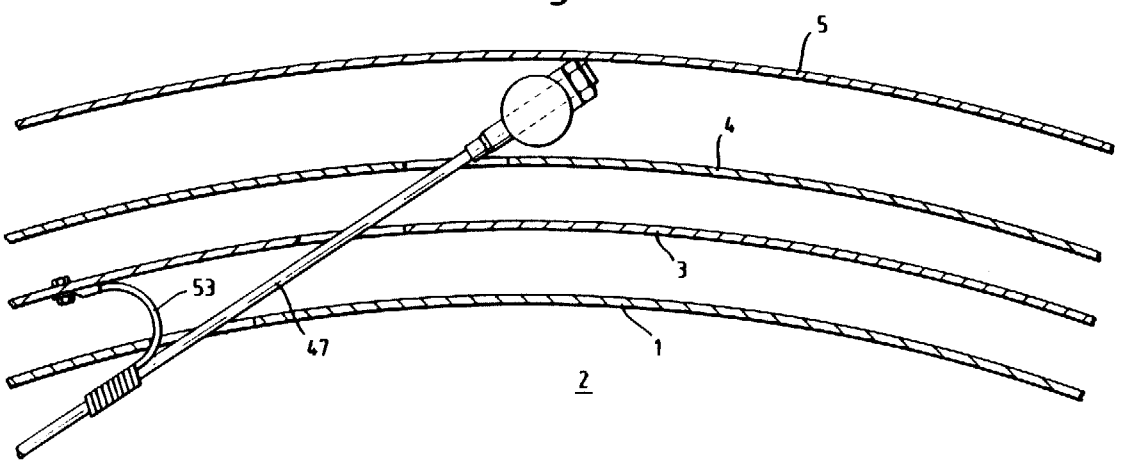

In a typical cryostat assembly, the various vessels and shields are supported by means of elongate tension rods as partly shown in FIG. 4 illustrates a coolant vessel 46 (such as a helium vessel) supported by a rod 47 extending between the vessel 46 and an outer vessel 48 (such as a nitrogen vessel) through an aperture 49 in an inner radiation shield 50. In a similar way the vessel 48 is supported by a tension rod 51 to an outer vacuum jacket 52. Since there may be some heat conductor along the rod 47 or 51, it is advantageous to couple the support rods with one of the walls of the cryostat to which the refrigeration unit 8 is coupled. As shown in FIG. 5, a suitable connection may be achieved between the support rod 47 and the inner shield 3 which, as seen in FIG. 2, is coupled to the second stage of the refrigerator unit 8. Coupling between the rod 47 and the shield 3 is achieved by connecting a flexible copper braid link 53 bolted to the inner shield 3 and whipped to the support rod by a brass wire. Other coupling methods are also possible.

I claim:

[1. A cryostat assembly comprising at least one substantially heat insulating wall defining a cooled region for restricting heat flow into said cooled region; a refrigeration system having a heat absorbing portion and a heat evacuating portion to enable absorbed heat to be evacuated from said cryostat assembly; and coupling means for coupling said heat absorbing portion with said wall to enable heat to transfer to said heat absorbing portion via said coupling means, said coupling means comprising at least one flexible, passive, heat conducting linkge.]

[2. An assembly according to claim 1, wherein said heat insulating wall comprises a heat radiation shield.]

[3. An assembly according to claim 1, wherein said wall is defined by at least part of a first coolant vessel.]

[4. An assembly according to claim 3, further comprising an inner heat radiation shield surrounding said region, said refrigeration system comprising a two stage refigeration system, said first stage of said system being coupled for heat transfer with said first coolant vessel and said second stage being coupled for heat transfer with said inner radiation shield.]

[5. An assembly according to claim 4, further comprising a second coolant vessel positioned within a volume defined by said inner radiation shield.]

[6. An assembly according to claim 1, wherein said wall is supported by a plurality of support rods, said refrigeration system being coupled for heat transfer with at least one of said support rods.]

[7. An assembly according to claim 6, wherein at least one of said support rods is coupled with another wall or vessel which itself is coupled with said refrigeration system whereby a heat flow path exists from said rod via said wall or vessel to said refrigeration system.]

[8. An assembly according to claim 1, wherein said coupling means comprises copper braid.]

[9. An assembly according to claim 1, wherein said refrigeration system further comprises a support housing, and a refrigeration unit removably mounted in said support housing, and wherein heat conducting contacts are provided on said unit and in said support housing connected with said coupling means whereby when said unit is fully mounted in said support housing said contacts engage one another to provide a heat path between said unit and said coupling means through said support housing, said support housing being adapted to restrict heat flow from outside said cryostat assembly to said coupling means.]

[10. An assembly according to claim 9, wherein said walls of the support housing are insulated against heat flow.]

[11. An assembly according to claim 9, wherein said coupling means comprises copper braid.]

*12. A cryostat assembly comprising at least one substantially heat insulating wall and at least one coolant containing or evacuated vessel surrounding a cooled region for restricting heat flow into said cooled region; a refrigeration system comprising a support housing, and a refrigeration unit having a heat absorbing portion and a heat evacuating portion to enable absorbed heat to be evacuated from said cryostat assembly, said refrigeration unit being removably mounted in said support housing, cooperating heat conducting contacts being provided on said unit and in said support housing whereby when said unit is fully mounted in said support housing said contacts engage one another to provide a path for heat to flow between said support housing and said heat absorbing portion; and coupling means connected between said support housing and said wall to conduct heat from said wall to said support housing, the arrangement being such that said refrigeration unit can be disassembled from the rest of said cryostat assembly without purging said vessel, wherein the interior of said support housing is isolated from the interior of each said coolant containing or evacuated vessel.*

*13. An assembly according to claim 12, wherein said vessel contains liquid nitrogen or liquid helium.*

*14. An assembly according to claim 12, wherein said wall coupled to said refrigeration unit is defined by at least part of said coolant containing or evacuated vessel.*

*15. An assembly according to claim 12, further comprising an inner heat radiation shield surrounding said region, said refrigeration system comprising a two stage refrigeration system, said first stage of said system being coupled for heat transfer with said vessel and a second stage being coupled for heat transfer with said inner radiation shield.*

*16. An assembly according to claim 15, further comprising another evacuated or coolant containing vessel positioned within a volume defined by said inner radiation shield.*

*17. An assembly according to claim 12, wherein said wall is supported by a plurality of support rods, said refrigeration system being coupled for heat transfer with at least one of said support rods.*

*18. An assembly according to claim 17, wherein at least one of said support rods is coupled with another wall or vessel which itself is coupled with said refrigeration system whereby a heat flow path exists from said rod via said wall or vessel to said refrigeration system.*

*19. An assembly according to claim 12, wherein said coupling means comprises a flexible, highly heat conductive linkage.*

*20. An assembly according to claim 19, wherein said coupling means comprises copper braid.*

*21. An assembly according to claim 12, wherein the walls of said support housing are insulated against heat flow.*

* * * * *